United States Patent
Uchida et al.

(10) Patent No.: US 7,768,202 B2
(45) Date of Patent: Aug. 3, 2010

(54) PLASMA DISPLAY DEVICE INCLUDING A CHASSIS MEMBER HAVING A PLURALITY OF DIVIDED BASE METAL PLATES

(75) Inventors: Keiji Uchida, Osaka (JP); Hiroshi Watanabe, Kyoto (JP); Tomio Shiota, Osaka (JP); Minoru Kobayashi, Osaka (JP)

(73) Assignee: Panasonic Corporation, Osaka (JP)

( * ) Notice: Subject to any disclaimer, the term of this patent is extended or adjusted under 35 U.S.C. 154(b) by 436 days.

(21) Appl. No.: 11/883,548

(22) PCT Filed: Dec. 27, 2006

(86) PCT No.: PCT/JP2006/025999
§ 371 (c)(1),
(2), (4) Date: Aug. 2, 2007

(87) PCT Pub. No.: WO2007/074848
PCT Pub. Date: Jul. 5, 2007

(65) Prior Publication Data
US 2008/0150427 A1    Jun. 26, 2008

(30) Foreign Application Priority Data
Dec. 27, 2005  (JP)  ............................. 2005-374463
Dec. 27, 2005  (JP)  ............................. 2005-374465

(51) Int. Cl.
*H01J 17/24*  (2006.01)
*H05K 7/16*  (2006.01)
*H05K 5/00*  (2006.01)

(52) U.S. Cl. ...................... 313/582; 361/725; 361/752; 313/583; 313/584; 313/585

(58) Field of Classification Search ...................... None
See application file for complete search history.

(56) References Cited

U.S. PATENT DOCUMENTS

| 7,091,665 B2 * | 8/2006 | Nomoto et al. ............. 313/583 |
| 7,120,010 B2 * | 10/2006 | Tajima .................. 361/679.21 |
| 2004/0027073 A1 * | 2/2004 | Nomoto et al. ............. 313/583 |
| 2008/0211406 A1 * | 9/2008 | Watanabe et al. ........... 313/582 |

FOREIGN PATENT DOCUMENTS

| JP | 11-153959 | 6/1999 |
| JP | 2003-29643 | 1/2003 |
| JP | 2003-131580 | 5/2003 |
| JP | 2004-317919 | 11/2004 |
| JP | 2005-91662 | 4/2005 |

* cited by examiner

*Primary Examiner*—Nimeshkumar D Patel
*Assistant Examiner*—Natalie K Walford
(74) *Attorney, Agent, or Firm*—Wenderoth, Lind & Ponack, L.L.P.

(57) ABSTRACT

A plasma display device includes a plasma display panel 11 that has a front substrate including a plurality of display electrodes arranged thereon and a rear substrate having data electrodes arranged thereon to cross the display electrodes, the front substrate and the rear substrate facing each other so as to form a discharge space, and chassis member 20 that holds plasma display panel 11 on a front side and has a driving circuit block for driving plasma display panel 11 on a rear side. Chassis member 20 has base plate 36 that is divided into a plurality of base metal plates 36*a*, 36*b*, and 36*c*, to which plasma display panel 11 is attached, and metal plates 37 and 38 that couple the plurality of base metal plates 36*a*, 36*b*, and 36*c* together.

6 Claims, 10 Drawing Sheets

PLASMA DISPLAY DEVICE INCLUDING A CHASSIS MEMBER HAVING A PLURALITY OF DIVIDED BASE METAL PLATES

TECHNICAL FIELD

The invention relates to a plasma display device that uses a plasma display panel (hereinafter, referred to as 'PDP') as a display device.

BACKGROUND ART

A PDP for a plasma display device is roughly classified into an AC type and a DC type in terms of driving, and also classified into a surface discharge type and an opposing discharge type in terms of discharging. In view of high definition, large screen, and ease of manufacturing, at present, a three-electrode surface discharge type PDP is becoming prevalent.

The surface discharge type PDP is composed of a pair of substrates having at least a transparent front surface that are disposed to face each other so as to form a discharge space therebetween. Barrier ribs are disposed on the substrates to partition the discharge space into a plurality of discharge spaces. Then, electrode groups are disposed on the substrates so as to cause discharge in the discharge spaces partitioned by the barrier ribs. Phosphor that emits red, green, and blue light during discharge is provided so as to form a plurality of discharge cells. Visible light is emitted from red, green, and blue discharge cells by exciting the phosphor with vacuum ultraviolet rays having a short wavelength generated during discharge, thereby performing color display.

A plasma display device using such a PDP features a higher display speed, a wider view angle, easier production of a large screen, and a higher display quality by self-luminescence, compared with an image display device using a liquid crystal panel. Because of the features, the PDP is getting a particular attention in flat panel displays and is used for various applications as a display device for public places and as a display device at home for enjoying a large screen image at home.

In such a plasma display device, the PDP primarily formed of glass is held on a front side of a metal chassis member formed of aluminum or the like. Further, on a rear side of the chassis member, a circuit board that constitutes a driving circuit for causing the PDP to emit light is disposed, thereby constituting a module. This example is disclosed in Japanese Patent Unexamined Publication No. 2003-131580.

In the plasma display device, since the large screen is easily realized, in recent years, the products having a size of 65 inches or more have been manufactured and sold. Further, with the demands for higher definition display, products of definition 768×1366 as well as products of higher definition 1080×1920 have been manufactured.

As such, as the large screen and high definition of the plasma display device are advanced, it is necessary to reform the parts constituting the products. In particular, with the advancement of the large screen of the PDP, a chassis member or a front protective cover for holding a large-screen PDP may be increased in weight in order to secure strength.

DISCLOSURE OF THE INVENTION

According to an aspect of the invention, a plasma display device includes a PDP that has a front substrate having a plurality of display electrodes arranged thereon and a rear substrate having data electrodes arranged thereon to cross the display electrodes, the front substrate and the rear substrate facing each other so as to form a discharge space, and a chassis member that holds the PDP on a front side and has a driving circuit block for driving the PDP on a rear side. The chassis member has a base plate that has a plurality of divided base metal plates, to which the PDP is attached, and metal plates that couple the plurality of base metal plates together.

According to the invention, even if the PDP has a larger screen, a chassis member having predetermined strength can be easily obtained, and thus a plasma display device suitable for a large screen can be obtained.

REFERENCE MARKS IN THE DRAWINGS

11: PDP
20: CHASSIS MEMBER
34: FRONT PROTECTIVE COVER
35: BACK COVER
35a, 35b, 35c, 35d: PARTITION COVER
36: BASE PLATE
36a, 36b, 36c, 37, 38: METAL PLATE
39, 40: HORIZONTAL ANGLE
41: VERTICAL ANGLE
42: HANGING BRACKET
44: FRONT FRAME
44a: FRONT FRAME OPENING
45: PROTECTIVE PLATE
46: PROTECTIVE PLATE PRESSING BRACKET
47: REINFORCING FRAME
47a: REINFORCING FRAME OPENING

PREFERRED EMBODIMENTS FOR CARRYING OUT THE INVENTION

Hereinafter, a plasma display device in an embodiment of the invention will be described with reference to FIGS. 1 to 8.

Embodiments

Figure 1:
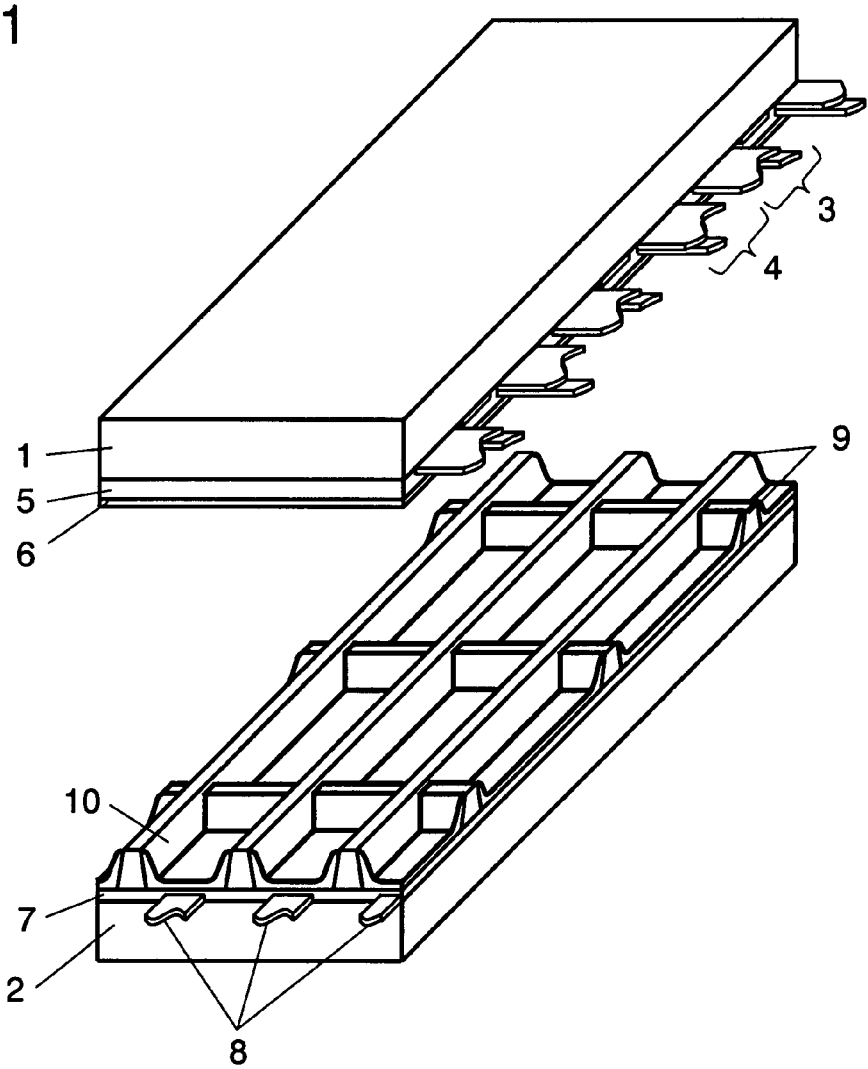
FIG. 1 is a perspective view showing essential parts of a PDP, which is used for a plasma display device, in an embodiment of the invention.

First, the structure of a PDP in a plasma display device will be described with reference to FIG. 1. As shown in FIG. 1, the PDP has front substrate 1 and rear substrate 2, formed of glass, which face each other so as to form a discharge space therebetween. On front substrate 1, a plurality of scanning electrodes 3 and a plurality of sustain electrodes 4 are formed in parallel with each other in pairs as display electrodes. Dielectric layer 5 is formed to cover scanning electrodes 3 and sustain electrodes 4, and protective layer 6 is formed on dielectric layer 5.

On rear substrate 2, a plurality of data electrodes 8 are provided to be covered with insulator layer 7, and lattice-shaped barrier rib 9 is provided on insulator layer 7. Phosphor layer 10 is provided on the surface of insulator layer 7 and the side surface of barrier rib 9. Front substrate 1 and rear substrate 2 are disposed to face each other such that scanning electrodes 3, and sustain electrodes 4 and data electrodes 8 cross each other. In the discharge space that is formed between the substrates, a mixed gas of neon and xenon is filled as a discharge gas. The structure of the PDP is not limited to the above-described structure. For example, stripe-shaped barrier ribs may be provided.

Figure 2:
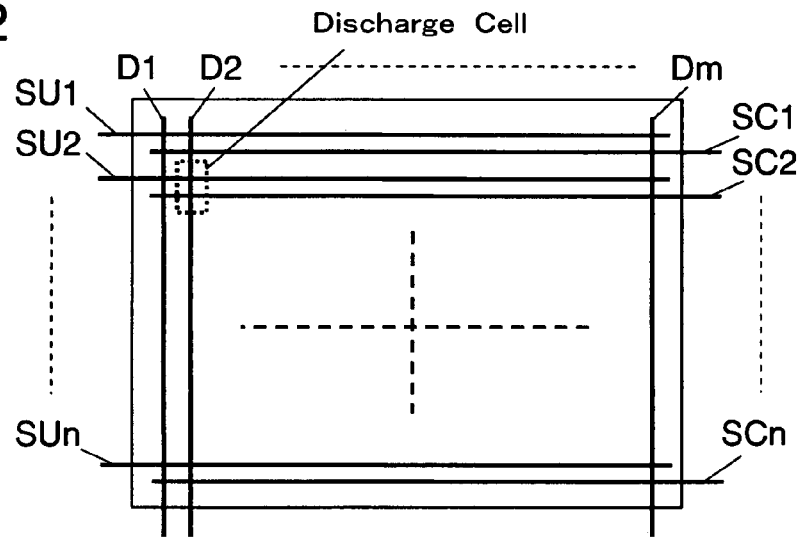
FIG. 2 is a diagram showing the electrode arrangement of the PDP.

FIG. 2 is a diagram showing the electrode arrangement of the PDP. In a row direction, n scanning electrodes SC1 to SCn (scanning electrodes 3 of FIG. 1) and n sustain electrodes SU1 to SUn (sustain electrodes 4 of FIG. 1) are arranged, and in a column direction, m data electrodes D1 to Dm (data electrodes 8 of FIG. 1) are arranged. A discharge cell is formed in a portion where a pair of scanning electrode SCi and sustain electrode SUi (where i=1 to n) and one data electrode Dj (where j=1 to m) cross each other. In the discharge space, m×n discharge cells are formed.

Figure 3:
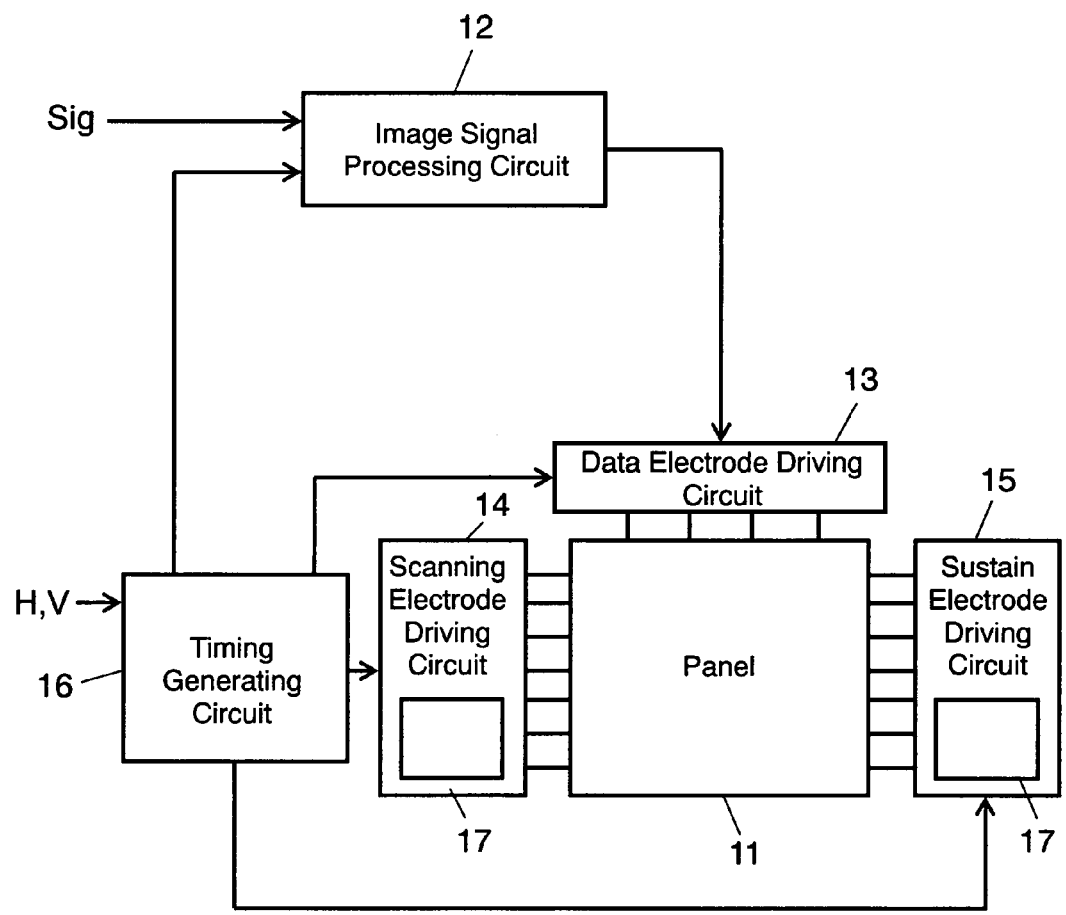
FIG. 3 is a circuit block diagram of the plasma display device.

FIG. 3 is a circuit block diagram of a plasma display device, which uses the PDP. The plasma display device includes PDP 11, image signal processing circuit 12, data electrode driving circuit 13, scanning electrode driving circuit 14, sustain electrode driving circuit 15, timing generating circuit 16, and power supply circuit (not shown).

Image signal processing circuit 12 converts image signal Sig into image data for each subfield. Data electrode driving circuit 13 converts the image data for each subfield into signals corresponding to data electrodes D1 to Dm, and drives data electrodes D1 to Dm. Timing generating circuit 16 generates various timing signals on the basis of horizontal synchronizing signal H and vertical synchronizing signal V and supplies the generated timing signals to the individual driving circuit blocks. Scanning electrode driving circuit 14 supplies driving voltage waveforms to scanning electrodes SC1 to SCn on the basis of the timing signals, and sustain electrode driving circuit 15 supplies driving voltage waveforms to sustain electrodes SU1 to SUn on the basis of the timing signals. Each of scanning electrode driving circuit 14 and sustain electrode driving circuit 15 has sustain pulse generating unit 17.

Figure 4:
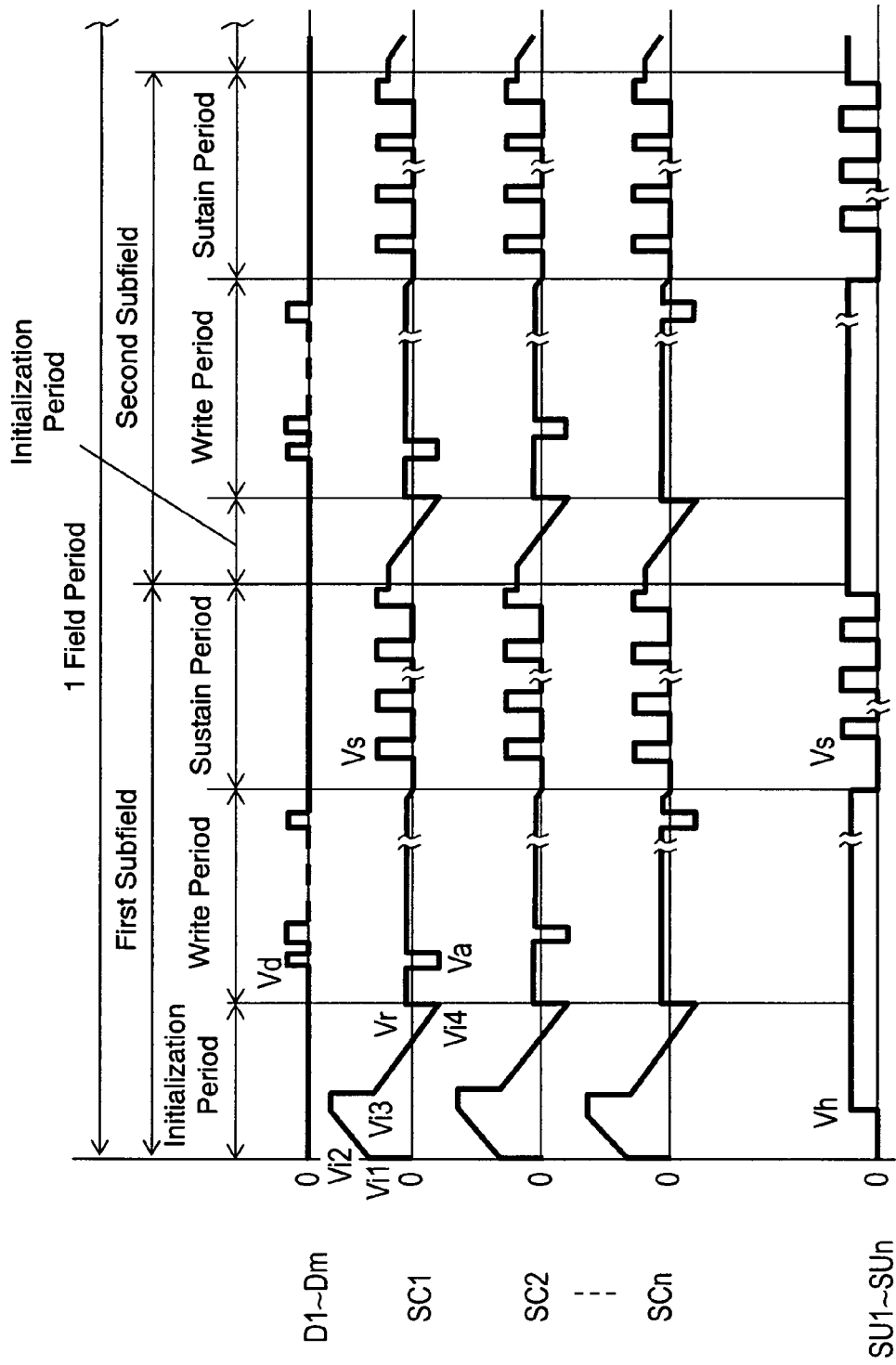
FIG. 4 is a waveform chart showing driving voltage waveforms that are applied to individual electrodes of the PDP.

Next, the driving voltage waveforms for driving PDP 11 and the operations thereof will be described with reference to FIG. 4. FIG. 4 is a diagram showing driving voltage waveforms that are applied to the individual electrodes of the PDP.

In the plasma display device of this embodiment, one field is divided into a plurality of subfields, and each of the subfields has an initialization period, a write period, and a sustain period.

In the initialization period of the first subfield, data electrodes D1 to Dm and sustain electrodes SU1 to SUn are kept to 0 (V), and a ramp voltage that gradually rises from voltage Vi1 (V) not more than a discharge start voltage to voltage Vi2 (V) more than the discharge start voltage is applied to scanning electrodes SC1 to SCn. If so, first weak initialization discharge is generated in all the discharge cells. Accordingly, a negative wall voltage is accumulated on scanning electrodes SC1 to SCn and a positive wall voltage is accumulated on sustain electrodes SU1 to SUn and data electrodes D1 to Dm. Here, the wall voltage on the electrode means a voltage that is generated by wall charges accumulated on the dielectric layer and the phosphor layer covering the electrode.

Subsequently, sustain electrodes SU1 to SUn are kept to positive voltage Vh (V), and a ramp voltage that gradually falls from voltage Vi3 (V) to voltage Vi4 (V) is applied to scanning electrodes SC1 to SCn. If so, second weak initialization discharge is generated in all the discharge cells. Accordingly, a wall voltage between scanning electrodes SC to SCn and sustain electrodes SU1 to SUn is weakened, and a wall voltage on data electrodes D1 to Dm is adjusted to a value suitable for a write operation.

In a subsequent write period, scanning electrodes SC1 to SCn are kept to Vr (V) once. Next, negative scanning pulse voltage Va (V) is applied to first row scanning electrode SC1, and positive write pulse voltage Vd (V) is applied to a data electrode Dk (where k=1 to m) of discharge cells to be displayed in the first row among the data electrodes D1 to Dm. At this time, a voltage at an intersection of data electrode Dk and scanning electrode SC1 is obtained by adding the wall voltage on data electrode Dk and the wall voltage on scanning electrode SC1 to external application voltage (Vd−Va) (V) and exceeds the discharge start voltage. If so, write discharge is generated between data electrode Dk and scanning electrode SC1 and between sustain electrode SU1 and scanning electrode SC1. Accordingly, a positive wall voltage is accumulated on scanning electrode SC1 of the corresponding discharge cell, and a negative wall voltage is accumulated on sustain electrode SU1. Further, the negative wall voltage is also accumulated on data electrode Dk.

In such a manner, write discharge is generated in the discharge cells to be displayed in the first row, and a write operation is performed so as to accumulate the wall voltage on the individual electrodes. Meanwhile, a voltage at each of intersections of data electrodes D1 to Dm, to which write pulse voltage Vd (V) is not applied, and scanning electrode SC1 does not exceed the discharge start voltage, and thus the write discharge is not generated. The write operation is performed to the discharge cells of the n-th row, and then the write period ends.

In the subsequent sustain period, positive sustain pulse voltage Vs (V) is applied to scanning electrodes SC1 to SCn as a first voltage, and a ground potential, that is, 0 (V) is applied to sustain electrodes SU1 to SUn as a second voltage. At this time, in the discharge cells where write discharge is generated, a voltage between scanning electrode SCi and sustain electrode SUi is obtained by adding the wall voltage on scanning electrode SCi and the wall voltage on sustain electrode SUi to sustain pulse voltage Vs (V) and exceeds the discharge start voltage. Then, sustain discharge is generated between scanning electrode SCi and sustain electrode SUi, and the phosphor layer emits light by ultraviolet rays generated during sustain discharge. Further, a negative wall voltage is accumulated on scanning electrode SCi, and a positive wall voltage is accumulated on sustain electrode SUi. At this time, the positive wall voltage is also accumulated on data electrode Dk.

In the discharge cells where write discharge is not generated in the write period, sustain discharge is not generated, and thus the wall voltage at the end of the initialization period is kept. Subsequently, 0 (V) as the second voltage is applied to scanning electrodes SC1 to SCn, and sustain pulse voltage Vs (V) as the first voltage is applied to sustain electrodes SU1 to SUn. If so, in the discharge cells where sustain discharge is generated, a voltage between sustain electrode SUi and scanning electrode SCi exceeds the discharge start voltage. Accordingly, sustain discharge is generated between sustain electrode SUi and scanning electrode SCi again. Then, a negative wall voltage is accumulated on sustain electrode SUi and a positive wall voltage is accumulated on scanning electrode SCi.

Similarly, sustain pulses are alternately applied to scanning electrodes SC1 to SCn and sustain electrodes SU1 to SUn in a number set according to a luminance weight. Then, in the discharge cells where write discharge is generated in the write period, sustain discharge is continuously performed. In such a manner, a sustain operation in the sustain period ends.

The operations of the initialization period, the write period, and the sustain period in the subsequent subfield are substantially the same as those in the first subfield, and the descriptions thereof will be omitted.

Figure 5:
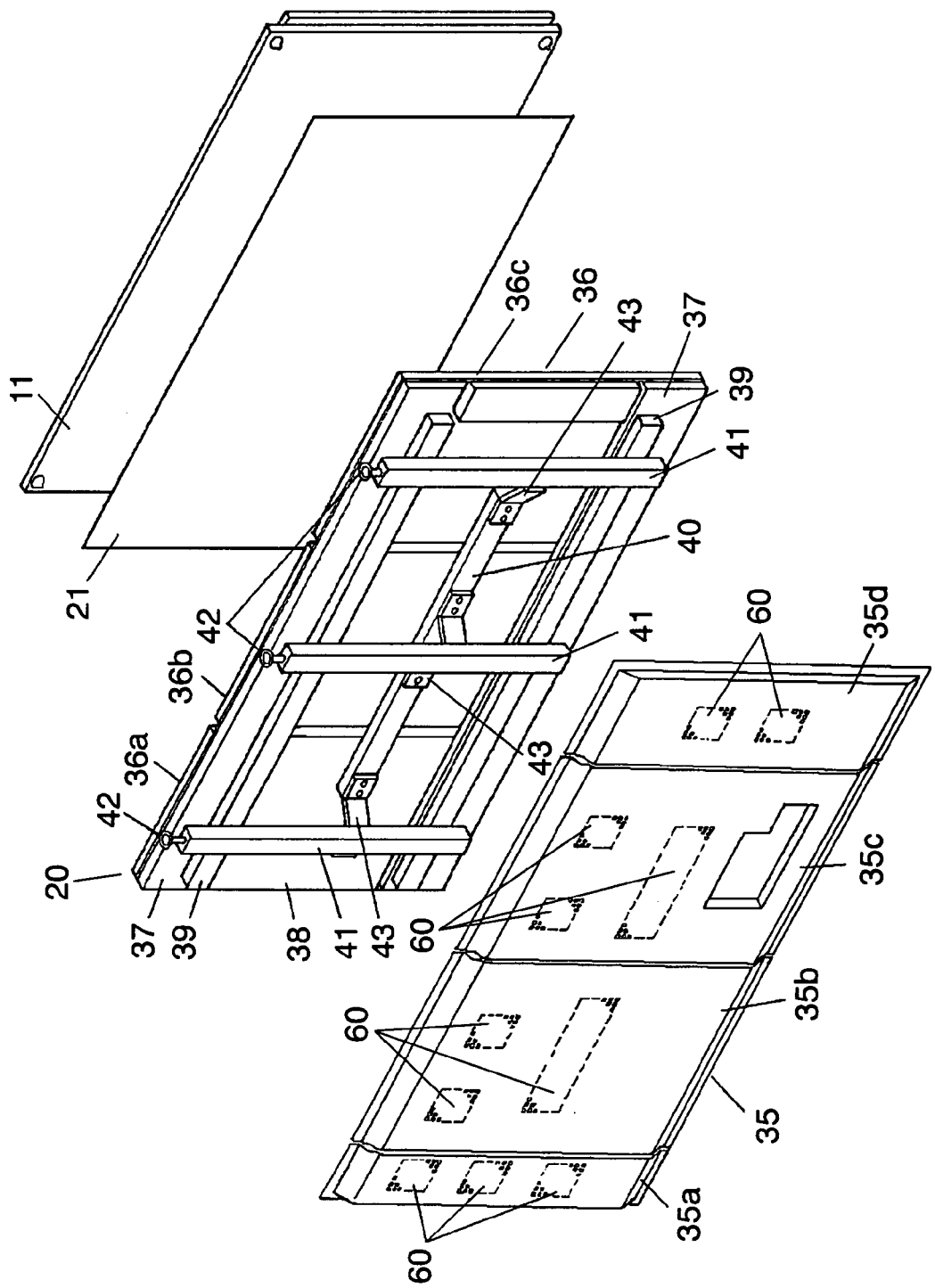
FIG. 5 is a perspective view showing the configuration of a rear side of the plasma display device.
Figure 6:
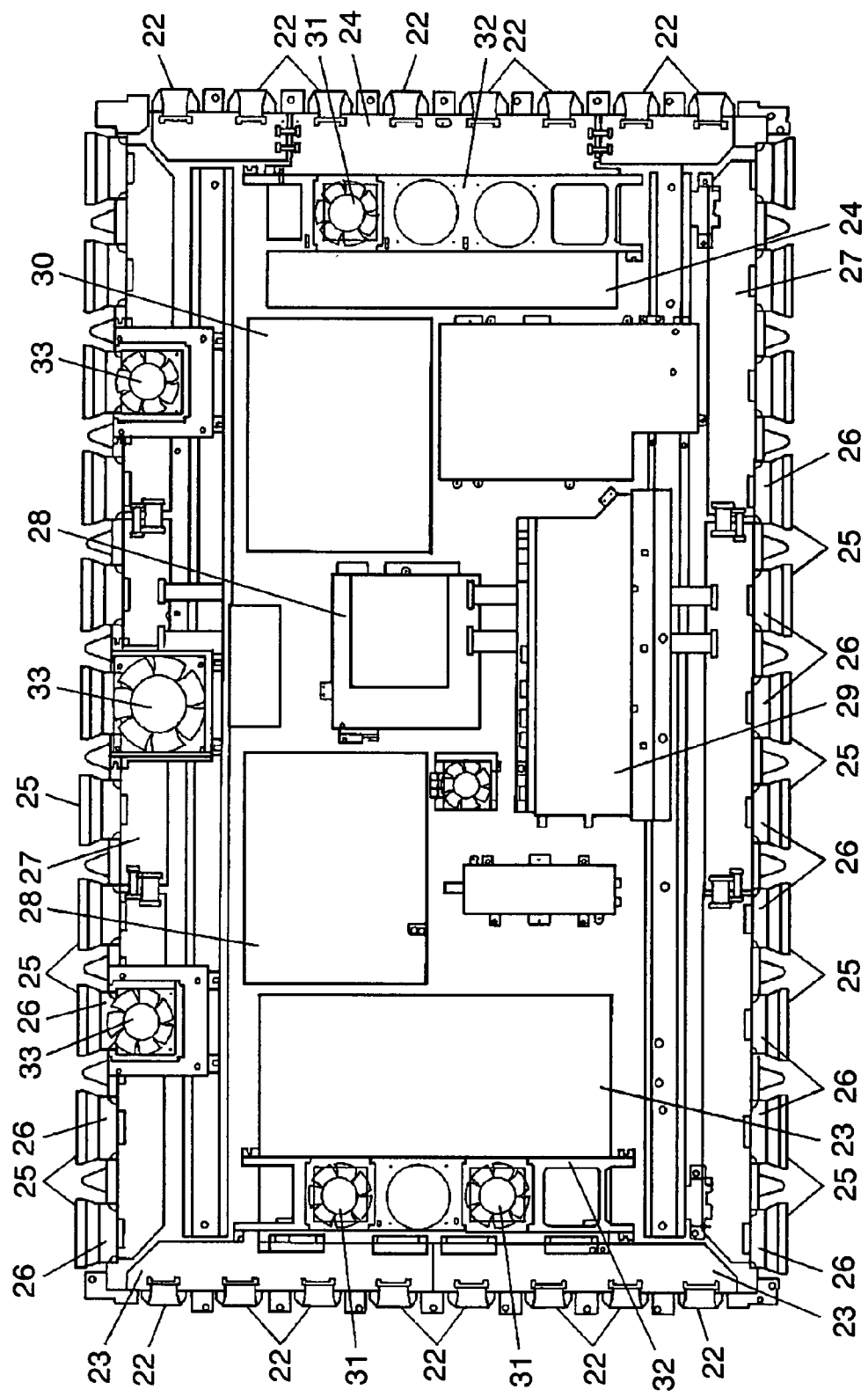
FIG. 6 is a plan view showing an example of the arrangement of the plasma display device as viewed from the rear side.
Figure 7:
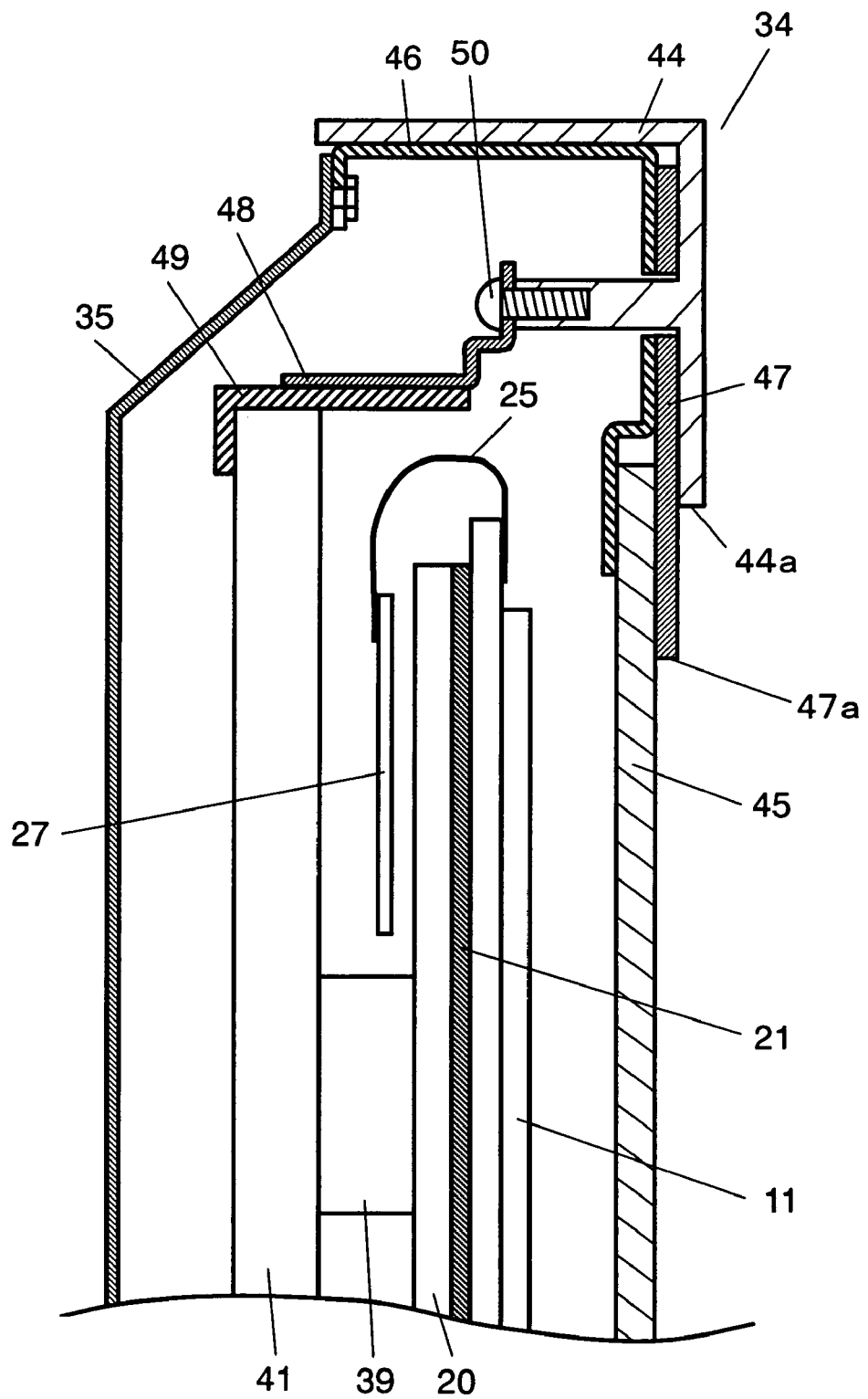
FIG. 7 is a cross-sectional view showing the sectional structure of essential parts of the plasma display device.

FIG. 5 shows an example of the overall configuration of a plasma display device into which a PDP having the above-described structure is incorporated. FIG. 6 shows an example of the arrangement of driving circuit blocks as viewed from a rear side. FIG. 7 shows a sectional structure of the plasma display device.

Referring to the drawings, on a front side of chassis member 20 as a holding plate as well as a metal heat radiation plate, PDP 11 is adhered to chassis member 20 with a heat radiation sheet 21 interposed therebetween by an adhesive or the like and then held. Further, as shown in FIG. 6, a plurality of driving circuit blocks for driving PDP 11 to display are disposed on the rear side of chassis member 20. Chassis member 20 and PDP 11 constitute a module as a single body.

Heat radiation sheet 21 holds PDP 11 by adhering PDP 11 to the front side of chassis member 20 and efficiently conducts heat generated in PDP 11 to chassis member 20 so as to perform heat radiation. The thickness of heat radiation sheet 21 is approximately 1 mm to 2 mm. Examples of heat radiation sheet 21 include an insulating heat radiation sheet, which is obtained by adding a filler to a synthetic resin material, such as acryl or urethane, silicon resin, or rubber, in order to increase heat conductivity, a graphite sheet, and a metal sheet. Alternatively, the heat radiation sheet may have adhesiveness, and PDP 11 may be adhered to chassis member 20 only with the heat radiation sheet and then held. Further, the heat radiation sheet may not have adhesiveness, and PDP 11 may be adhered to chassis member 20 using an additional double-sided adhesive tape.

At both edges of PDP 11, flexible wiring boards 22 are provided as display electrode wiring members, which are connected to lead portions of scanning electrodes 3 and sustain electrodes 4. Flexible wiring boards 22 are led to the rear side of chassis member 20 through the outer circumference of chassis member 20, and then connected to driving circuit block 23 of scanning electrode driving circuit 14 and driving circuit block 24 of sustain electrode driving circuit 15 through connectors.

Meanwhile, at lower and upper edges of PDP 11, a plurality of flexible wiring boards 25 are provided as data electrode wiring members, which are connected to lead portions of data electrodes 8. Flexible wiring boards 25 are electrically connected to a plurality of data drivers 26 of data electrode driving circuit 13. Further, flexible wiring boards 25 are led to the rear side of chassis member 20 through the outer circumference of chassis member 20, and then electrically connected to driving circuit blocks 27 of data electrode driving circuit 13, which are disposed at lower and upper portions on the rear side of chassis member 20.

Control circuit block 28 is substantially disposed in the central portion of chassis member 20. Control circuit block 28 converts image data into image data signals according to the number of pixels of the panel 11 on the basis of an image signal transmitted from an input signal circuit block 29 having an input terminal portion, to which a connection cable for connection to an external apparatus, such as a television tuner, is detachably connected, and supplies the converted image data signals to driving circuit block 27 of data electrode driving circuit 13. In addition, control circuit block 28 generates a discharge control timing signal, and supplies the generated discharge control timing signal to driving circuit block 23 of scanning electrode driving circuit 14 and driving circuit block 24 of sustain electrode driving circuit 15, thereby performing display driving control, such as grayscale control.

Power supply block 30 supplies power to the individual circuit blocks. Similarly to control circuit block 28, power supply block 30 is substantially disposed in the central portion of chassis member 20, and then a commercial power supply voltage is supplied through a connector, on which a power cable (not shown) is mounted. Driving circuit blocks 23, 24, and 27, control circuit block 28, input signal circuit block 29, and power supply block 30 are fixed to boss portions provided on the rear side of chassis member 20 by screws or the like.

Around driving circuit blocks 23 and 24, cooling fan 31 is disposed to be held by an angle 32, such that driving circuit blocks 23 and 24 are cooled by wind from cooling fan 31. In addition, in the upper portion of chassis member 20, cooling fan 33 is provided to cool driving circuit block 27 of data electrode driving circuit 13 disposed in the upper portion and to by cool the inside of the device generating an air flow from the lower portion toward the upper portion inside the entire device on the rear side of chassis member 20.

As shown in FIG. 7, the module having the above-described structure is accommodated in a casing having front protective cover 34 disposed on the front side of PDP 11 and a metal back cover 35 disposed on the rear side of chassis member 20, thereby completing a plasma display device. As shown in FIG. 5, back cover 35 is provided with a plurality of air holes 60 that discharge heat generated in the module to the outside.

Next, the configuration of chassis member 20, and front protective cover 34 and back cover 35 constituting the casing in the plasma display device according to the invention will be described in detail with reference to FIGS. 5 and 7 to 9.

Figure 8:
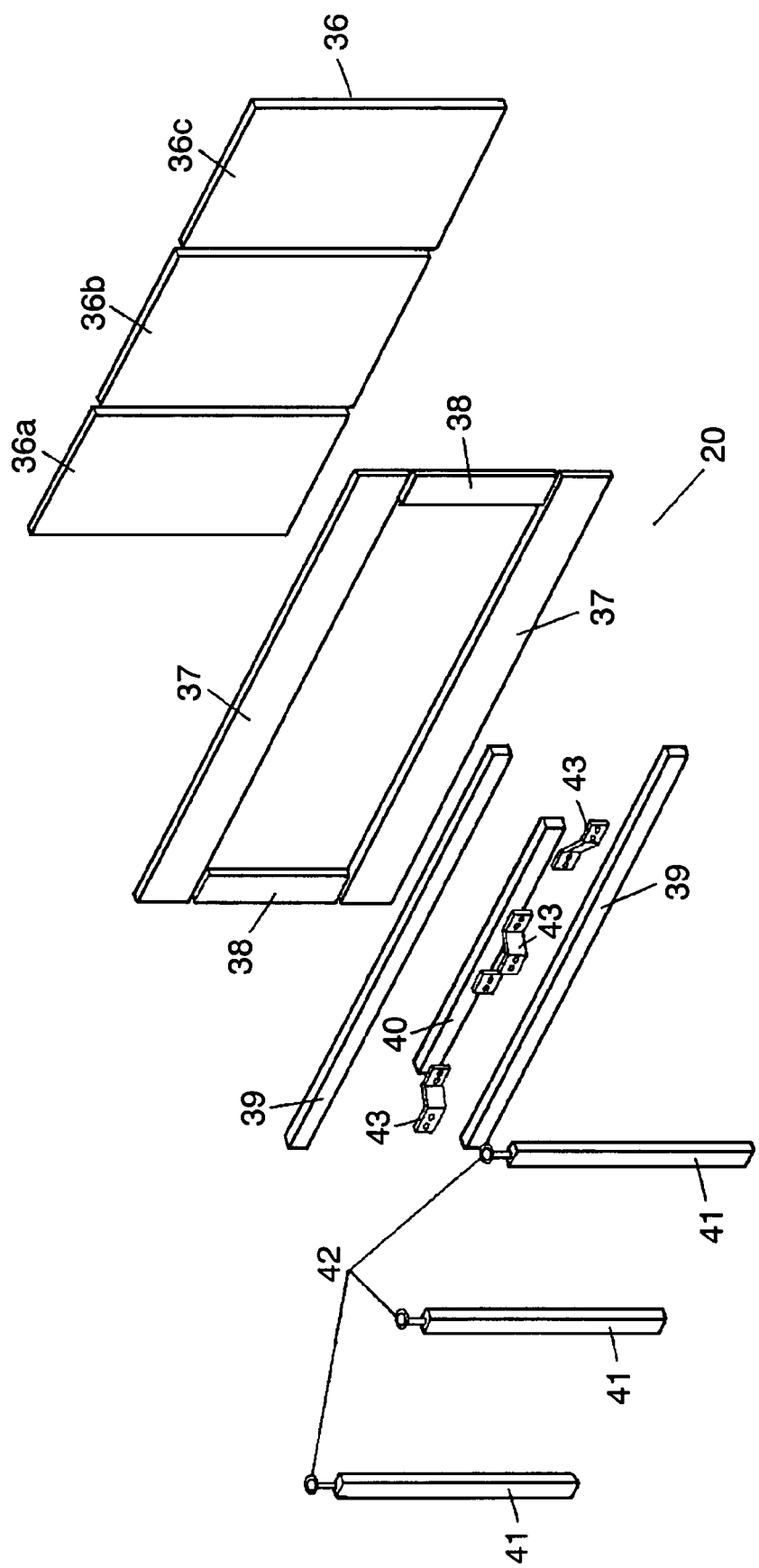
FIG. 8 is a perspective view showing an example of a chassis member of the plasma display device.

First, chassis member 20 will be described in detail with reference to FIGS. 5 and 8. FIG. 8 is an exploded perspective view of chassis member 20.

As shown in FIG. 8, chassis member 20 includes base plate 36 that has a plurality (in the drawings, three) of base metal plates 36a, 36b, and 36c, such as an aluminum plate, to which PDP 11 is attached, metal plates 37 and 38 that are fixed to overlap base plate 36 and couple base metal plates 36a, 36b, and 36c together, and a plurality of rectangular horizontal angles 39 and 40 and vertical angles 41 that reinforce horizontal and vertical strength of base plate 36.

Metal plates 37 are composed of an aluminum plate, and fixed to overlap upper and lower edges on the rear side of base plate 36 to couple base metal plates 36a, 36b, and 36c, thereby reinforcing base plate 36. Metal plates 38 are also composed of an aluminum plate, and are fixed to overlap edges on the rear sides of left and right base metal plates 36a and 36c of base plate 36, thereby reinforcing base plate 36.

Two horizontal angles 39 are fixed to overlap metal plates 37 so as to reinforce horizontal strength of base plate 36. In addition, one horizontal angle 40 is fixed to overlap base plate 36 so as to couple base metal plates 36a, 36b, and 36c together and to reinforce horizontal strength of base plate 36.

Three vertical angles 41 are fixed to bridge two horizontal angles 39 and cross them at right angles, thereby reinforcing vertical strength of base plate 36. At upper ends of three vertical angles 41 fixed in the vertical direction, hanging brackets 42 are respectively fixed so as to hang and transport the plasma display device. With the hanging brackets 42, a large plasma display device having a large screen is easily hung and transported. Further, middle portions of three vertical angles 41 are fixed to horizontal angles 40 fixed to base plate 36 through coupling brackets 43.

Chassis member 20 includes base plate 36 having a plurality of base metal plates 36a, 36b, and 36c, and metal plates 37 and 38 that are fixed to overlap base plate 36 and couple base metal plates 36a, 36b, and 36c together. Accordingly, chassis member 20 that holds PDP 11 having a larger screen can be easily realized without performing a processing, such as press molding, on base plate 36.

In particular, when forming chassis member 20 that holds PDP 11 having a large screen of approximately 100 inches by processing and molding one thin metal plate, it is difficult to secure flatness of the front surface of chassis member 20, to which PDP 11 is attached. For this reason, a thick metal plate is processed to form chassis member 20, and then chassis member 20 may be increased in weight.

In the invention, base plate 36 of chassis member 20, to which PDP 11 is attached, is divided into a plurality of base metal plates 36a, 36b, and 36c, and base metal plates 36a, 36b, and 36c are coupled by metal plates 37 and 38 together. For this reason, flatness of the surface, to which PDP 11 is attached, is easily secured, and thus light-weight chassis member 20 can be easily obtained.

Figure 9:
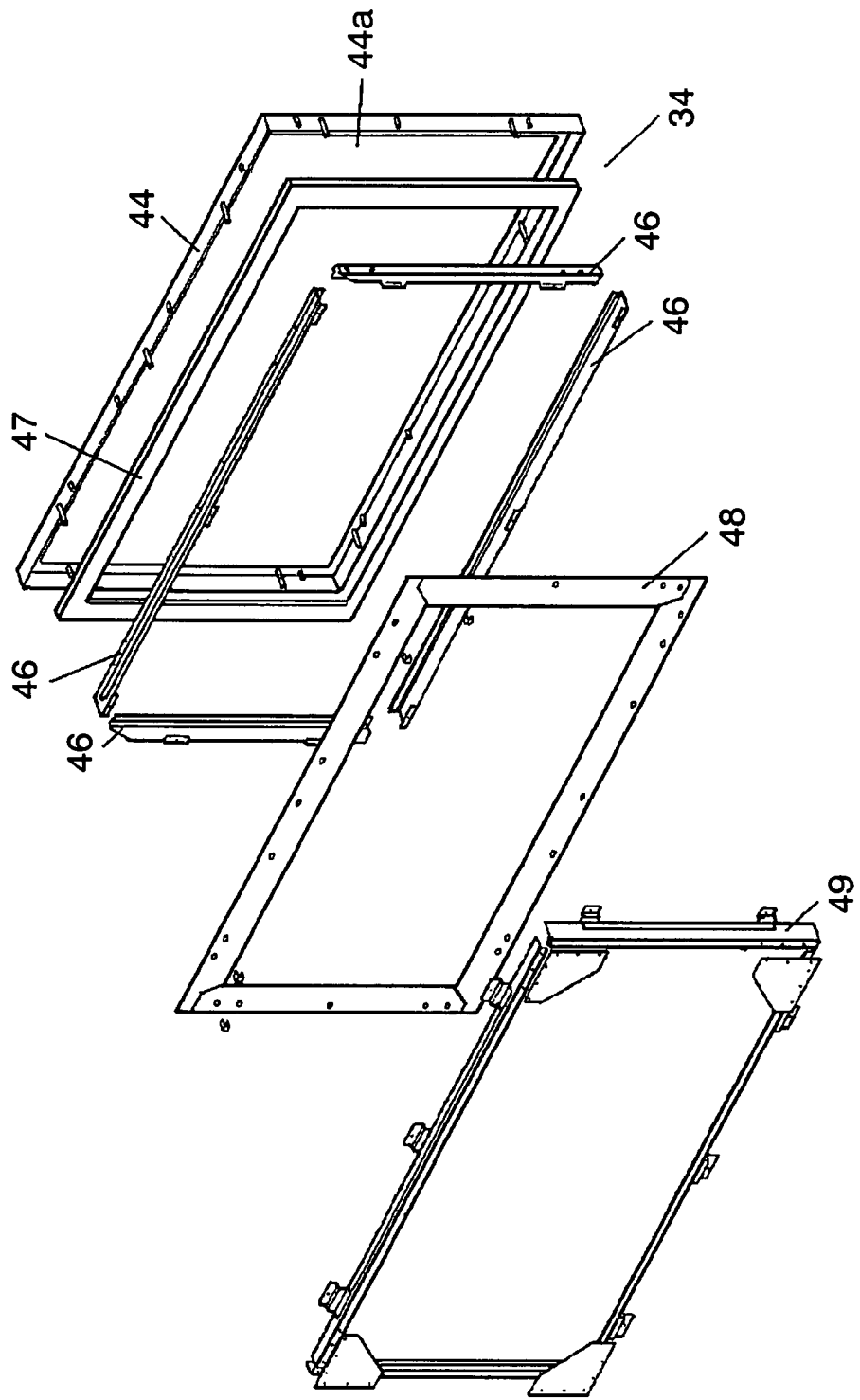
FIG. 9 is a perspective view showing an example of a front protective cover of the plasma display device.

Next, the configuration of front protective cover 34 and back cover 35 constituting the casing will be described in detail with reference to FIGS. 5, 7, and 9. FIG. 9 is an exploded perspective view of front protective cover 34.

As shown in FIGS. 7 and 9, front protective cover 34 includes front frame 44 that is formed of resin or a metal and has front frame opening 44a, through which an image display region on the front side of PDP 11 is exposed, and protective plate 45 that is attached to front frame opening 44a of front frame 44 and is formed of glass provided with an optical filter or an unnecessary radiation suppressing film for suppressing unnecessary radiation of electromagnetic waves. Protective plate 45 is attached to front frame 44 by sandwiching the periphery of protective plate 45 with the edge of front frame opening 44a of front frame 44 and protective plate pressing brackets 46 through reinforcing frame 47.

Reinforcing frame 47 is masked such that a non-display region of PDP 11 is not caught by a viewer. Reinforcing frame 47 is provided to improve exterior design of the plasma display device. In addition, reinforcing frame 47 is formed of resin or a metal to have reinforcing frame opening 47a corresponding to the display region of PDP 11. The size of reinforcing frame 47 is set such that the edge of reinforcing frame opening 47a is exposed through front frame opening 44a of front frame 44. Front surface of reinforcing frame 47 is subjected to a gloss treatment or a satin finish treatment.

In front protective cover 34, mounting brackets 48 and 49 are provided to attach protective plate pressing brackets 46 to front frame 44, and to attach front frame 44 to horizontal angles 39 of chassis member 20. As shown in FIG. 7, by attaching mounting bracket 48 to front frame 44 with screws 50 and attaching mounting bracket 48 to chassis member 20 through mounting bracket 49, front protective cover 34 is attached to chassis member 20. Accordingly, the non-display region of PDP 11 can be reliably masked, and protective plate 45 can be reliably fixed to front protective cover 34.

Next, as shown in FIGS. 5 and 7, back cover 35 is divided into a plurality of parts (in the drawings, four parts), and a plurality of partition covers 35a to 35d are attached to vertical angles 41 of chassis member 20 and protective plate pressing brackets 46 of front protective cover 34 by screws (not shown).

As such, in the invention, front protective cover 34 includes front frame 44 that is formed of resin or a metal to have front frame opening 44a, through which the image display region on the front side of PDP 11 is exposed, and protective plate 45 that is attached to front frame opening 44a of front frame 44 and formed of glass provided with an optical filter or an unnecessary radiation suppressing film for suppressing unnecessary radiation of electromagnetic waves. In addition, protective plate 45 is attached to front frame 44 by sandwiching the periphery thereof with the edge of front frame opening 44a of front frame 44 and protective plate pressing brackets 46 through reinforcing frame 47. That is, in addition to front frame 44, additional reinforcing frame 47 is provided. For this reason, front protective cover 34 can have enough strength to protect the front surface of PDP 11, without increasing the thickness of front frame 44.

In particular, with the large screen of the PDP, the external size of front frame 44 and the area of front frame opening 44a are increased. In this case, if the thickness of front frame 44 is the same, strength of front frame 44 is lowered. However, by additionally providing reinforcing frame 47 as a trim inside front frame 44a, front protective cover 34 can have enough strength.

In the invention, back cover 35 is divided into a plurality of parts and attached to reinforcing vertical angles 41 of chassis member 20, and back cover 35 and front protective cover 34 constitute the casing. For this reason, a casing of a plasma display device using large-screen PDP 11 can be simply formed.

Next, a mounting structure on a stand that holds a large plasma display device, for example, the plasma display device of the invention, to self-stand will be described with reference to FIGS. 10 to 13.

Figure 10:
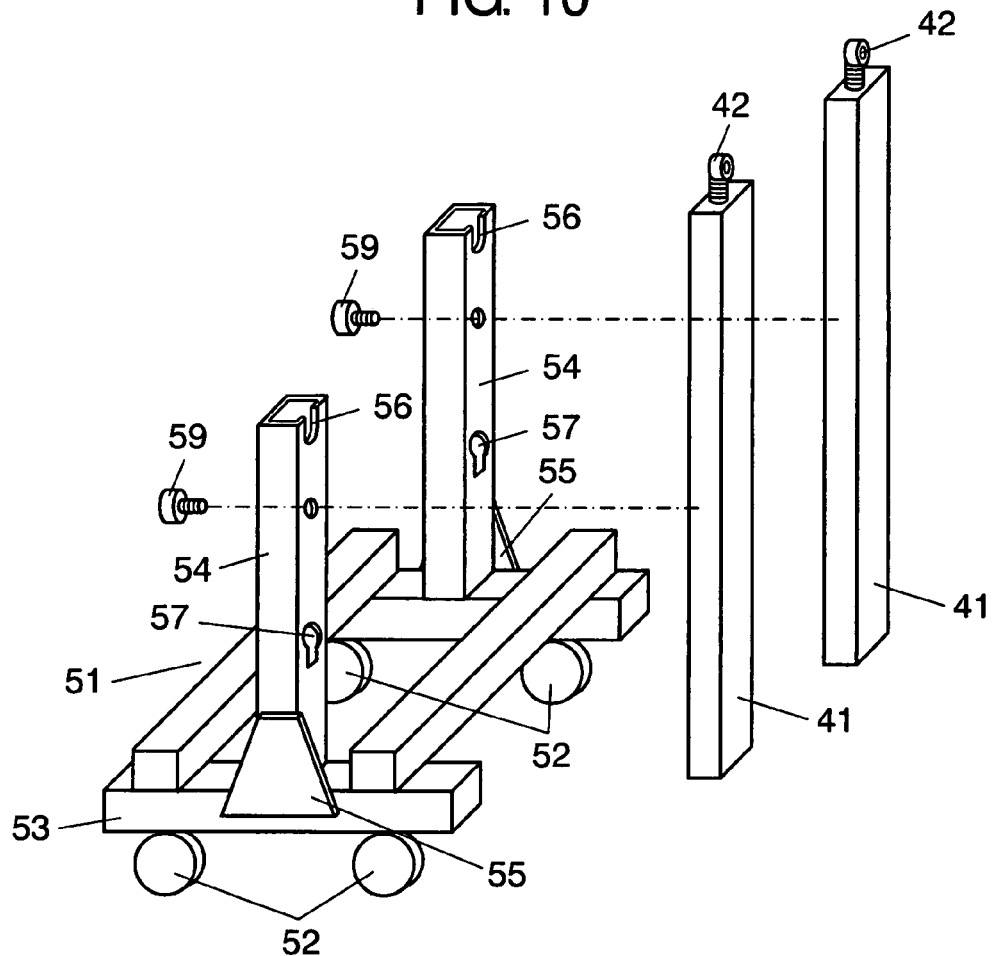
FIG. 10 is a perspective view showing an example of a stand for holding a large plasma display device to self-stand.
Figure 11:
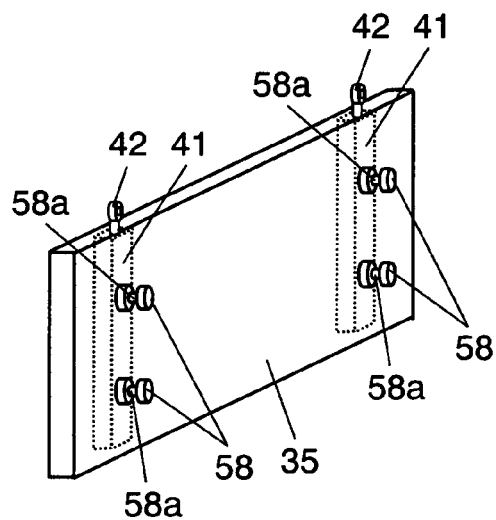
FIG. 11 is a perspective view of a large plasma display device as viewed from a rear side.
Figure 12:
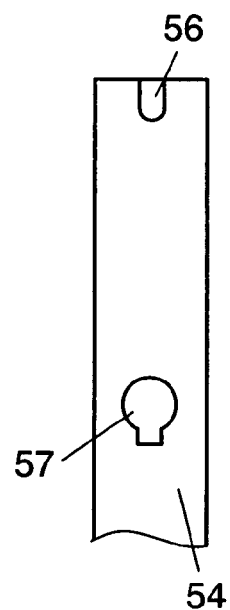
FIG. 12 is a plan view showing the structure of essential parts of a stand shown in FIG. 10.
Figure 13:
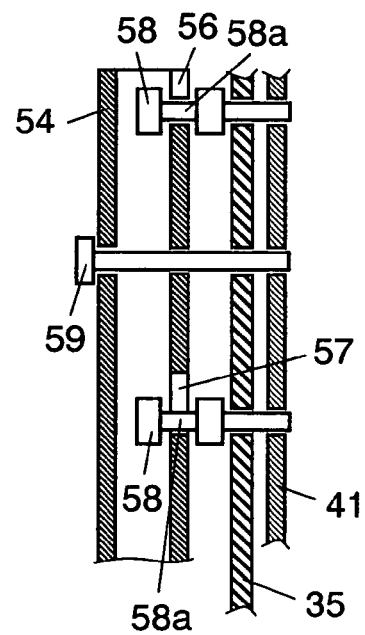
FIG. 13 is a cross-sectional view showing the structure of essential parts in a state where a plasma display device is attached to a stand shown in FIG. 10.

FIG. 10 is a perspective view showing an example of a stand that holds a large plasma display device to self-stand. FIG. 11 is a rear view of the above-described large plasma display device as viewed from back cover 35 side. FIG. 12 is a plan view showing the structure of essential parts of the stand shown in FIG. 10. FIG. 13 is a cross-sectional view showing the structure of essential parts in a state the plasma display device is attached to the stand shown in FIG. 10.

As shown in FIG. 10, stand 51 is configured by attaching two rectangular metal supports 54 to carrier 53 having casters 52. Supports 54 are attached to carrier 53 upright by joining metal fixing plates 55 with carrier 53 and supports 54 by welding or the like. Further, FIG. 10 show vertical angles 41 in the plasma display device to assist understanding of positional relationship between stand 51 and the plasma display device.

On a surface of each support 54 of stand 51, to which the plasma display device is attached, as shown in FIGS. 10 and 12, U-shaped notch 56 is provided in the uppermost portion, and keyhole-shaped engagement hole 57 is provided in the middle portion.

On the rear side of the plasma display device, as shown in FIG. 11, four cylindrical engagement blocks 58, each having small-diameter portion 58a in the middle portion, passes through back cover 35 and are screwed to vertical angles 41. Further, engagement blocks 58 are fixed to two vertical angles 41 on both sides among three vertical angles 41 shown in FIG. 5. Engagement blocks 58 are fitted into notches 56 and engagement holes 57 provided in supports 54 of stand 51, such that small-diameter portions 58a are engaged with notches 56 and engagement holes 57.

That is, according to the mounting structure of the plasma display device shown in FIGS. 10 to 13, as shown in FIG. 11, small-diameter portions 58a of engagement blocks 58 are engaged with notches 56 and engagement holes 57, such that the plasma display device is temporarily fixed to supports 54 of stand 51. Subsequently, as shown in FIGS. 10 and 13, supports 54 of stand 51 and vertical angles 41 of the plasma display device are fixed to each other by fixing screws 59. In such a manner, the plasma display device can be easily attached to stand 51.

INDUSTRIAL APPLICABILITY

As described above, the invention is useful to provide a large-screen plasma display device.

The invention claimed is:

1. A plasma display device comprising:
a plasma display panel including a front substrate having a plurality of display electrodes arranged thereon, and a rear substrate having data electrodes arranged thereon to cross the display electrodes, wherein the front substrate and the rear substrate are arranged to face each other so as to form a discharge space therebetween;
a chassis member that holds the plasma display panel on a front side of the chassis member, the chassis member including a driving circuit block for driving the plasma display panel, and the driving circuit block being located on a rear side of the chassis member; and
a heat radiation sheet for bonding the plasma display panel to the chassis member,
wherein the chassis member includes a base plate having a plurality of divided base metal plates,
wherein the base plate is attached to the heat radiation sheet, to which the plasma display panel is attached, and
wherein the chassis member includes metal plates that couple the plurality of divided base metal plates together, the metal plates being fixed to the plurality of divided base metal plates.

2. The plasma display device of claim 1,
wherein the chassis member includes horizontal angles for reinforcing horizontal strength, and vertical angles for reinforcing vertical strength, the vertical angles being attached to the horizontal angles.

3. The plasma display device of claim 2, further comprising:
hanging brackets,
wherein the hanging brackets are fixed at upper ends of the vertical angles of the chassis member.

4. A plasma display device comprising:
a plasma display panel including a front substrate having a plurality of display electrodes arranged thereon, and a rear substrate having data electrodes arranged thereon to cross the display electrodes, wherein the front substrate and the rear substrate are arranged to face each other so as to form a discharge space;
a chassis member that holds the plasma display panel on a front side of the chassis member, the chassis member including a driving circuit block for driving the plasma display panel, and the driving circuit block being located on a rear side of the chassis member;
a heat radiation sheet for bonding the plasma display panel to the chassis member;
a front protective cover; and
a back cover,
wherein the front protective cover and the back cover constitute a casing for accommodating a module of the chassis member and the plasma display panel as a single body,
wherein the chassis member includes a base plate having a plurality of divided base metal plates,
wherein the base plate is attached to the heat radiation sheet, to which the plasma display panel is attached, and
wherein the chassis member includes metal plates that couple the plurality of divided base metal plates together, the metal plates being fixed to the plurality of divided base metal plates.

5. The plasma display device of claim 4,
wherein the back cover includes a plurality of divided partition covers, and the plurality of divided partition covers are attached to the chassis member.

6. The plasma display device of claim 5,
wherein the chassis member includes horizontal angles for reinforcing horizontal strength, and vertical angles for reinforcing vertical strength, the vertical angles being attached to the horizontal angles, and
wherein the plurality of divided partition covers of the back cover are respectively attached to the vertical angles.

* * * * *